(12) United States Patent
Iwamoto et al.

(10) Patent No.: US 6,566,788 B2
(45) Date of Patent: *May 20, 2003

(54) SURFACE ACOUSTIC WAVE DEVICE

(75) Inventors: Osamu Iwamoto, Chino (JP); Koichi Morozumi, Suwa (JP); Yuji Mitsui, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/967,978

(22) Filed: Oct. 2, 2001

(65) Prior Publication Data

US 2002/0017837 A1 Feb. 14, 2002

Related U.S. Application Data

(63) Continuation of application No. 09/581,470, filed as application No. PCT/JP99/05624 on Oct. 12, 1999.

(30) Foreign Application Priority Data

Oct. 16, 1998 (JP) ............................... 10-314098

(51) Int. Cl.[7] ............................................. H02L 41/08
(52) U.S. Cl. ............................... 310/313 R; 310/313 B
(58) Field of Search ........................... 310/313 R, 313 B

(56) References Cited

U.S. PATENT DOCUMENTS

| | | | | |
|---|---|---|---|---|
| 4,189,516 A | * | 2/1980 | Dryburgh et al. | 428/409 |
| 4,906,885 A | * | 3/1990 | Kojima et al. | 310/313 B |
| 5,059,847 A | | 10/1991 | Tanaka et al. | |
| 5,061,870 A | * | 10/1991 | Ieki et al. | 310/313 A |
| 5,162,690 A | * | 11/1992 | Ieki et al. | 310/313 R |
| RE37,102 E | | 3/2001 | Tada | 310/313 B |

FOREIGN PATENT DOCUMENTS

| | | |
|---|---|---|
| JP | A-61-73409 | 4/1986 |
| JP | A-7-46074 | 2/1995 |
| JP | A-8-148966 | 6/1996 |
| JP | B2-2545983 | 8/1996 |

* cited by examiner

Primary Examiner—Thomas M. Dougherty
Assistant Examiner—Karen Addison
(74) Attorney, Agent, or Firm—Oliff & Berridge, PLC.

(57) ABSTRACT

A surface acoustic wave device is provided having a substrate made of quartz, a pair of inter digital transducer-shaped electrodes made of an aluminum layer, an electrode pad, and a pair of lattice-shaped reflectors made of the same material as the electrode. The crystal structure of the aluminum layer composing the electrode is a twin crystal structure, where crystal grains of the (–1 1 1) plane and the (0 0 2) plane and crystal grains of the (1 –1 –1) plane and the (0 0 –2) plane are in a twin crystal relationship with the (–1 1 –1) plane and the (1 –1 1) plane of aluminum as the twin boundaries. Also, the {1 1 1} plane of the aluminum layer is oriented to an 8° inclination relative to the {0 1 0} plane of quartz composing the substrate.

2 Claims, 8 Drawing Sheets

DIFFRACTION PHOTO ①

DIFFRACTION PHOTO ②

SURFACE ACOUSTIC WAVE DEVICE

This is a continuation of application Ser. No. 09/581,470 filed Jun. 14, 2000, which in turn is a U.S. National Stage Application of PCT/JP99/05624, filed Oct. 12, 1999. The entire disclosure of the prior application(s) is hereby incorporated by reference herein in its entirety.

BACKGROUND OF THE INVENTION

1. Field of the Invention

This invention relates, for example, to a surface acoustic wave device used for oscillators, filters, resonators, and the like.

2. Description of Related Art

In electronic equipment using high-frequency waves such as portable telephones and wireless communicators, surface acoustic wave devices are widely used for filters, resonators, oscillators, and the like, inside such electronic equipment.

This is a inter digital transducer-type electrode installed on a piezoelectric substrate such as quartz.

Conventionally, randomly-oriented polycrystalline aluminum has been used as this electrode.

However, in a surface acoustic wave device where such an electrode is used, oscillation frequency varies along with its use, preventing it from obtaining a constant frequency stably over a long period.

In order to overcome such a shortcoming, disclosed is the use of aluminum alloy as the electrode, although the orientation is random (Pat Pub Sho 61-47010).

However, even in such an electrode, when a surface acoustic wave device is used for a long period, the oscillation frequency changes over time, making it difficult to use a surface acoustic wave device stably over a long period.

The objective of this invention is to provide a surface acoustic wave device with an oscillation frequency that is hard to change over time.

SUMMARY OF THE INVENTION

The exemplary embodiments of the methods and systems of this invention to solve the above problems are as follows:
(1) A surface acoustic wave device that has a substrate made of piezoelectric material, and an electrode installed on the substrate and oscillates by conduction to the electrode, the electrode may consist of polycrystalline aluminum layer whose crystal boundaries are twin boundaries.
(2) The surface acoustic wave device described above, where the piezoelectric material is quartz.
(3) The surface acoustic wave device described above, where the substrate is an ST-cut substrate of a rotational Y plate obtained by rotating a quartz Y plate by 10° to 60° around the X axis.
(4) The surface acoustic wave device described above, where the {1 1 1} plane of the aluminum is oriented to be inclined by 1° to 30° relative to the {0 1 0} plane of the said piezoelectric material.
(5) The surface acoustic wave device described above, where the (−1 1 −1) plane and the (1 −1 1) plane of the aluminum are twin boundaries.
(6) The surface acoustic wave device described above, where the crystal grain of the (−1 1 1) plane and the (0 0 2) plane of the aluminum and the crystal grain of the (1 −1 −1) plane and the (0 0 −2) plane are in a twin crystal relationship.
(7) The surface acoustic wave device described above, where the thickness of the layer is 0.05 μm to 20 μm.
(8) The surface acoustic wave device described above, where the oscillation frequency is 10 MHz to 5000 MHz.
(9) The surface acoustic wave device described above, where the frequency change after 1000 hours of use is 50 ppm or smaller.
(10) The surface acoustic wave device described above, which has a reflector that strengthens the vibration.
(11) The surface acoustic wave device described above, where the reflector is made of the same kind of material as the electrode.

DETAILED DESCRIPTION OF THE EMBODIMENTS

The present invention is explained hereafter, with reference to the preferred embodiment of the attached drawings.

Figure 1:
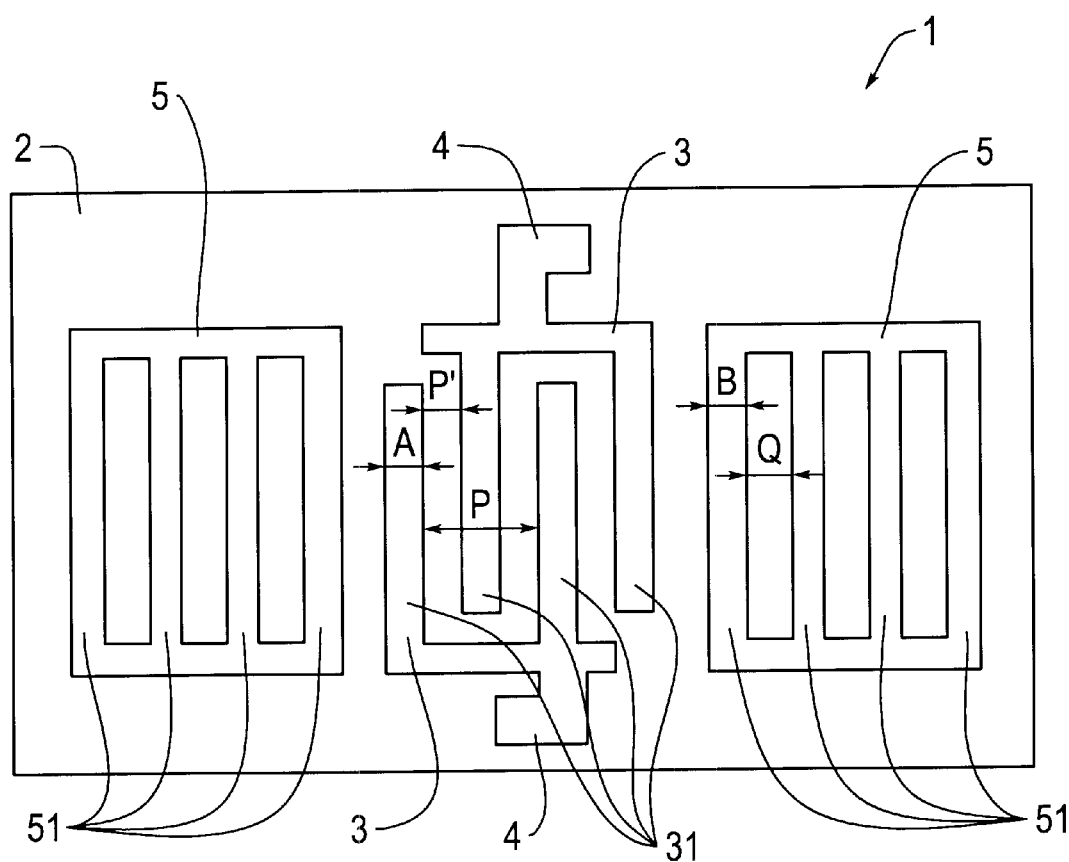
FIG. 1 is a plane view showing an embodiment of the surface acoustic wave device of this invention.

FIG. 1 is a planar view showing an embodiment of the surface acoustic wave device of this invention.

As shown in FIG. 1, the surface acoustic wave device has a substrate 2, an electrode 3, an electrode pad 4, and a reflector 5.

The surface acoustic wave device 1 is sealed in a package, not shown. Also, the package is filled with an inert gas, such as nitrogen. Thus, the surface acoustic wave device 1 is made to be stronger against influences such as external temperature, humidity, shock, oxygen, and the like. As the package, use can be made, for example, of a ceramic package, a cylindrical package, and the like.

The planar form of the substrate 2 has an almost rectangular shape. Also, the substrate 2 is made of a piezoelectric material. Hence, if the voltage is charged to the substrate 2, the substrate 2 vibrates. Also, through the vibration of the substrate 2, the surface acoustic wave device 1 oscillates.

As the piezoelectric material for the substrate 2, the use of quartz is preferred. The vibration frequency of the quartz is difficult to change, even if the ambient temperature changes. Therefore, by using quartz as the piezoelectric material for the substrate 2, a surface acoustic wave device 1 can be obtained with an oscillation frequency that is difficult to change, even if the ambient temperature changes.

If the substrate 2 is quartz, although the kind of the substrate is not particularly limited, an ST-cut substrate is preferable. Among these, a rotational Y-plate ST-cut substrate obtained by rotating a Y plate around the X axis by 10° to 60° is preferable, and more preferable is a rotational Y-plate ST-cut substrate obtained by rotating a Y plate around the X axis by 20° to 40°. If this kind of substrate is used, the surface acoustic wave device 1, which has excellent oscillation properties, especially small temperature coefficient of frequency, can be obtained.

The thickness of the substrate 2 should preferably be about 0.05 mm to 10 mm, and more preferably 0.1 mm to 1 mm from the viewpoint of oscillation performance.

On the substrate 2, a pair of electrodes 3 are installed which may consist of an aluminum layer. The electrodes 3 charge a voltage to the substrate 2. Namely, by conducting an electrode 3, a voltage is charged to the substrate 2, and by this, the substrate 2 vibrates and the surface acoustic wave device 1 oscillates.

The electrodes 3 have an inter digital transducer shape, and both electrodes are non-contacting and positioned so that the inter digital transducer of one of the electrodes combines with the inter digital transducer of the other electrode.

The width A of strips 31 composing the inter digital transducer of an electrode 3 is ¼th the wavelength $\lambda$ at which the substrate 2 vibrates, respectively. Also, the distance P between the strips 31 of the same electrode 3 is ¾th the wavelength $\lambda$. Also, the distance P' between the strip 31 of one electrode 3 and another strip 31 of the other neighboring electrode 3 is ¼th the wavelength $\lambda$.

Although the number of strips 31 per pair of electrodes 3 is not particularly limited, about 10 to 500 pairs are preferable, and about 50 to 300 pairs are more preferable. If the number of strips 31 is in this range, the surface acoustic wave device 1 vibrates more efficiently.

The {1 1 1} plane of aluminum composing the electrodes 3 should preferably be oriented obliquely to the {0 1 0} plane of the piezoelectric material composing the substrate 2 by 1° to 30°, and more preferably 5° to 15°. A surface acoustic wave device 1 having an inclined orientation in this range is easy to manufacture, and one with an excellent oscillation performance is easy to obtain.

The aluminum layer of the electrodes 3 is a polycrystal, and the crystal grain boundary is a twin boundary (a crystal grain boundary where the neighboring crystal grains are in a twin-crystal relationship). Thus, even if the surface acoustic wave device 1 is used for a long period, its oscillation frequency becomes difficult to change. This is believed to be due to the following reasons.

If the aluminum layer is a polycrystal, grain-boundary energy arises. Grain-boundary energy is energy generated by the formation of grain boundaries dividing the individual crystals composing the polycrystal. In this case, if it is made of a polycrystal in the same way as conventional aluminum electrodes, and the orientation of each crystal composing this polycrystal is random, the grain-boundary energy becomes large. If grain-boundary energy becomes large, the crystal moves little by little when vibration is applied to the electrode. Because of this, if the vibration is applied to this kind of electrode for a long time, namely, if a surface acoustic wave device having this kind of electrode is used for a long time, the electrode is believed to degrade over time, as does its oscillation frequency (i.e. a migration occurs).

On the other hand, if the crystal grain boundary of crystals composing the aluminum layer is a twin-crystal boundary, namely, if the neighboring crystals are in a twin-crystal relationship, the grain-boundary energy becomes small. Because of this, even if vibration is applied to the electrode for a long period, grains composing the aluminum layer become difficult to move. Therefore, if an electrode 3 is composed of a polycrystalline aluminum layer whose crystal grain boundaries are twin boundaries, even when the surface acoustic wave device 1 is used for a long period, the electrode 3 hardly degrades over time, and its oscillation frequency hardly varies (migration occurs with difficulty).

Here, in this invention, the fact that "a crystal grain boundary is a twin boundary" does not mean that all of the crystal grain boundaries inside the aluminum layer are twin boundaries, but means that the existence of twin boundaries can be confirmed when electron beam diffraction is performed on the aluminum layer composing the electrodes 3.

From the viewpoint of the stability of the grain boundaries, the aluminum layer composing the electrodes 3 should preferably have a (−1 1 −1) plane and a (1 −1 1) plane of aluminum as the twin boundaries.

Also, from the same viewpoint, in the aluminum layer composing the electrodes 3, it is preferable that the crystal grain of the (−1 1 1) plane and the (0 0 2) plane and the crystal grain of the (1 −1 −1) plane and the (0 0 −1) plane of aluminum be in a twin relationship.

By making the aluminum layer of the electrodes 3 have the crystal structure, a surface acoustic wave device can be obtained having a vibration property (especially the oscillation frequency) that is difficult to change over time.

Although the thickness of an electrode 3 is not particularly limited, about 0.05 $\mu$m to 20 $\mu$m is preferable, and about 0.1 $\mu$m to 1 $\mu$m is more preferable. If the thickness of the electrode 3 is within this range, a surface acoustic wave device 1 with an excellent oscillation performance can be obtained.

On the end section of an electrode 3, installed is an electrode pad (terminal) 4. To this electrode pad 4, connected is a wire (not shown), and electric current is supplied from outside to the electrode 3 through this wire.

On both sides of the electrodes 3 on the substrate 2, a lattice-shape reflector 5 is installed in the position away from the electrodes 3. This reflector 5 has the function of amplifying the vibration generated by the substrate 2.

Width B of each strip 51 composing the lattice of the reflector 5 is ¼th the wavelength $\lambda$ at which the substrate 2 vibrates. Also, the interval Q of strips 51 of the reflector 5 is ¼th the wavelength $\lambda$. Also, both ends of each strip 51 are short-circuited.

Although the number of strips 51 per reflector 5 is not particularly limited, about 20 to 1500 is preferable, and 50 to 1000 is more preferable. If the number of strips 51 is within this range, the surface acoustic wave device 1 vibrates more efficiently.

The reflector 5 should preferably be made of the same material as the electrodes 3. Thus, the change in vibration properties due to the degradation of the reflector 5 over time is also suppressed, and even if the surface acoustic wave device 1 is used for a long period, the oscillation frequency becomes difficult to vary.

The oscillation frequency of this kind of surface acoustic wave device 1 should preferably be about 10 MHz to 5000 MHz, and more preferably 100 MHz to 2500 MHz. When the oscillation frequency of the surface acoustic wave device 1 is within this range, the surface acoustic wave device 1 shows more excellent oscillation properties.

Also, the change in the oscillation frequency of the surface acoustic wave device 1 after 1000 hours of use should preferably be 50 ppm or less, more preferably be 20 ppm or less, and even more preferably be 10 ppm or less. This kind of surface acoustic wave device 1 can be used stably for an extended period.

Above, this invention was explained in detail based on the preferable embodiment shown in the attached drawings. However, this invention is not limited to this.

For example, although, in the embodiment, an explanation was made using quartz as an example of the piezoelectric material used for the substrate 2, this invention is not limited to this, but lithium niobate ($LiNbO_3$), lithium tantalate ($LiTaO_3$), and the like, can be used as the piezoelectric material for the substrate 2, for example.

For example, although, in the embodiment, an aluminum layer was used for the electrodes 3, other components can be contained in the aluminum to the extent that it does not obstruct the crystal structure, and also inevitable impurities can be contained in the aluminum. Furthermore, aluminum-system alloy may be used for the electrodes 3.

As the aluminum-system alloy, for example, an alloy of aluminum and copper can be used. Other than copper, alloy where titanium (Ti), silicon (Si), and tantalum (Ta) are mixed with aluminum can be also used. As for these aluminum alloys, mixing within 10 wt % is preferable, and more preferable is mixing within 2 wt %. Especially, for copper (Cu), mixing should preferably be within 1 wt %, and more preferably within the range of 0.1 wt % to 10 wt %. Furthermore, with this invention, mixing should preferably be within the range of 0.5 to 1 wt %. Here, the aluminum-system alloys containing the above-listed mixing materials have the property that the crystal grain boundaries are twin boundaries. They are different from the following alloys whose orientation is random.

EMBODIMENTS

1. Manufacturing a Surface Acoustic Wave Device

A surface acoustic wave device was manufactured by the following method.

[1.1] First of all, a quartz substrate with an external form of 20×30 mm and a thickness 0.4 mm was prepared as a piezoelectric substrate. This quartz substrate was a rotational Y-plate ST-cut substrate obtained by rotating a quartz Y plate around the X axis by 33°.

[1.2] Next, this quartz substrate was washed with acid to clean the surface of the quartz substrate.

[1.3] Next, on the surface of this quartz substrate, an aluminum layer of a thickness of about 0.25 $\mu$m was formed by the vacuum vapor coating method. The vapor coating speed was 0.002 $\mu$m/s, the vapor coating temperature was 130° C., and the pressure prior to vapor coating was 0.5 $\mu$Torr.

[1.4] Next, a resist by photolithograph was made, and etching was performed with this resist as a mask to the quartz substrate where the aluminum film was formed to remove the unnecessary part of the aluminum film. Thus, a pattern shown in FIG. 1 was formed on the aluminum layer on the quartz substrate. Namely, on the quartz substrate, are formed a pair of electrodes, electrode pads installed on the end sections of the electrodes, and a reflector positioned in a separate place on both sides of the electrodes.

[1.5] Next, this quartz substrate (wafer) where the electrodes, the electrode pads, and the reflector were formed was cut into a 2×3 mm chip, wire bonding was performed on the electrode pads to connect the wires, and further packaging was done with a ceramic package to obtain a surface acoustic wave device. Here, packaging was done while nitrogen gas was being filled into the packaging.

The width A of the electrode strips of the obtained surface acoustic wave device is 2.5 $\mu$m, the interval P of the strips on the same electrode is 10 $\mu$m, and the interval of the strip of one electrode and the strip of the neighboring other electrode is 2.5 $\mu$m. Also, the width B of the strip of the reflector is 2.5 $\mu$m, and interval Q of the strips is 2.5 $\mu$m. Also, the number of strips on the electrode is 130 pairs, and the number of strips per reflector is 130 pieces.

Also, the oscillation frequency of the obtained surface acoustic wave device is 300 MHz.

2. Analyzing a Surface Acoustic Wave Device

[2.1] Observation of a cross section of a surface acoustic wave device by an electron microscope.

Figure 2:
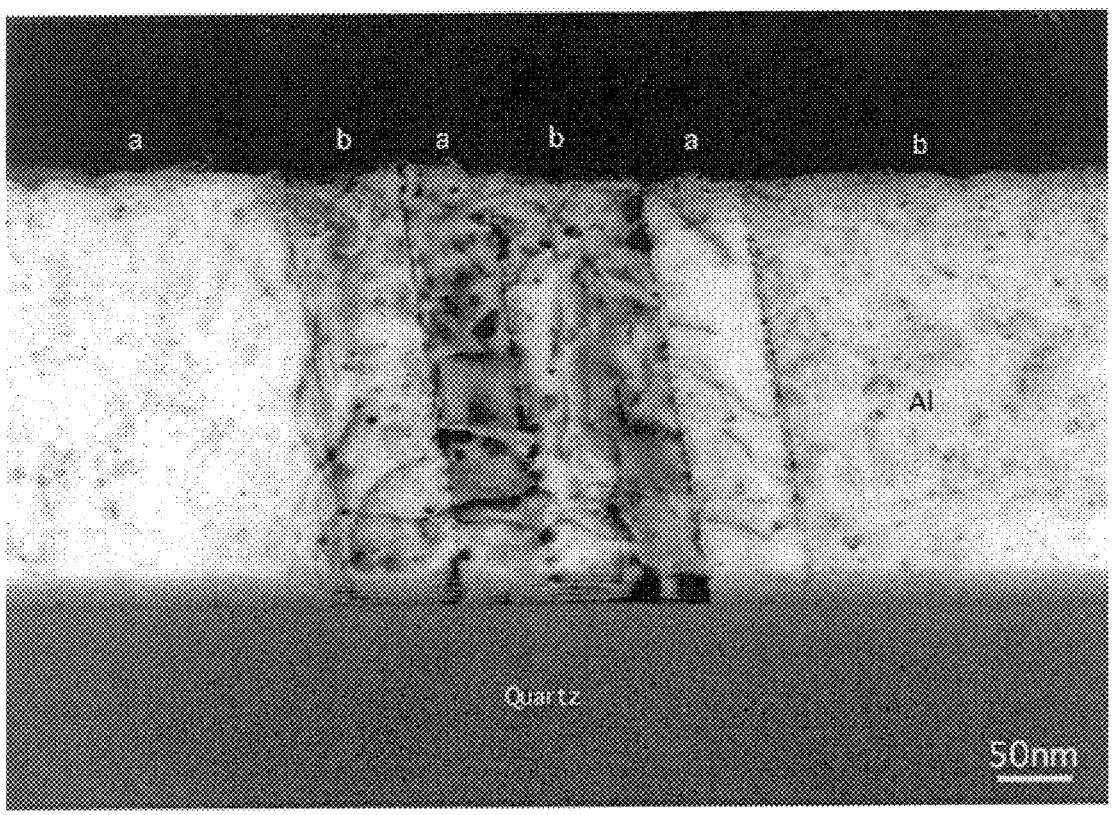
FIG. 2 is a cross-sectional bright-field photo made by a transmission electron microscope (TEM).

A cross section of a surface acoustic wave device before packaging obtained in the same way as the above [1.1] to [1.4] was observed by a transmission electron microscope (TEM). The obtained electron microscope photo is shown in FIG. 2. The magnification of the photographs was 75,000 times.

In FIG. 2, the lower layer is quartz, and the upper layer is aluminum.

As shown in the electron microscope photo in FIG. 2, grain boundaries in the aluminum layer are oriented in a constant direction. Thus, it has been confirmed that the aluminum layer has a twin boundaries. Also, from this photo, it turns out that the neighboring crystal grain a and the crystal grain b are in a twin relationship.

Furthermore, as shown in FIG. 2, the interfaces of grain boundaries in the aluminum layer are very smooth because they are twin boundaries. Therefore, compared with a polycrystalline aluminum layer composing an electrode of conventional surface acoustic wave devices where the crystal grains are randomly oriented, the aluminum layer of the surface acoustic wave device of this invention is believed to have very small interface energy. The reason why the oscillation frequency of the surface acoustic wave device of this invention is difficult to change even when it is used for a long period is believed to lie here.

In this instance, as the transmission electron microscope, a Philips "CM-200FEG" (acceleration voltage 200 kV) was used. Also, the observed sample was prepared by the FIB method.

Furthermore, the following measurements were performed for this sample in order to confirm the results.

Figure 3:
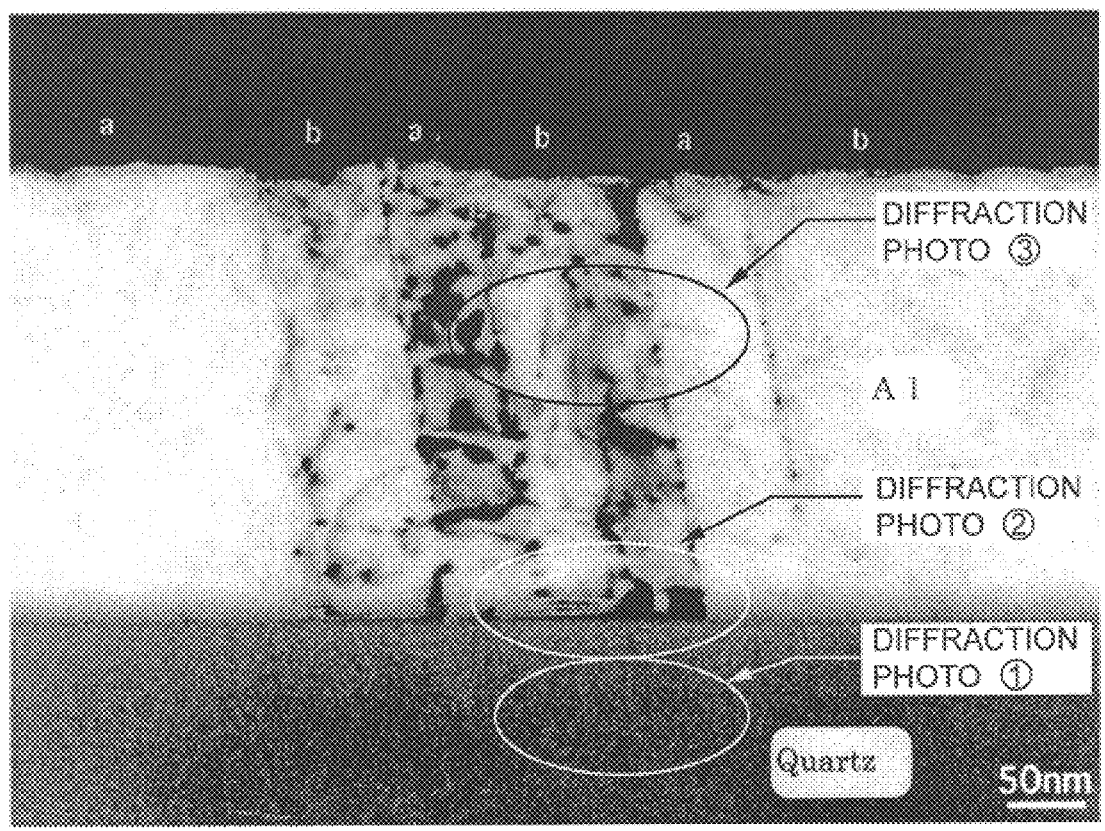
FIG. 3 is a figure showing the diffraction parts of the transmission electron beam diffraction photos shown in FIG. 4, FIG. 5, and FIG. 6.

[2. 2] Analyzing the surface acoustic wave device using transmission electron beam diffraction The sample observed under an electron microscope in the above [2. 1] was analyzed using limited field electron beam diffraction. Electron beam diffraction was performed individually for the three parts (quartz part, boundary part of quartz and aluminum film, and aluminum film part) surrounded by the frames in FIG. 3. Here, FIG. 3 is a figure showing the same objects as shown in FIG. 2.

Figure 4:
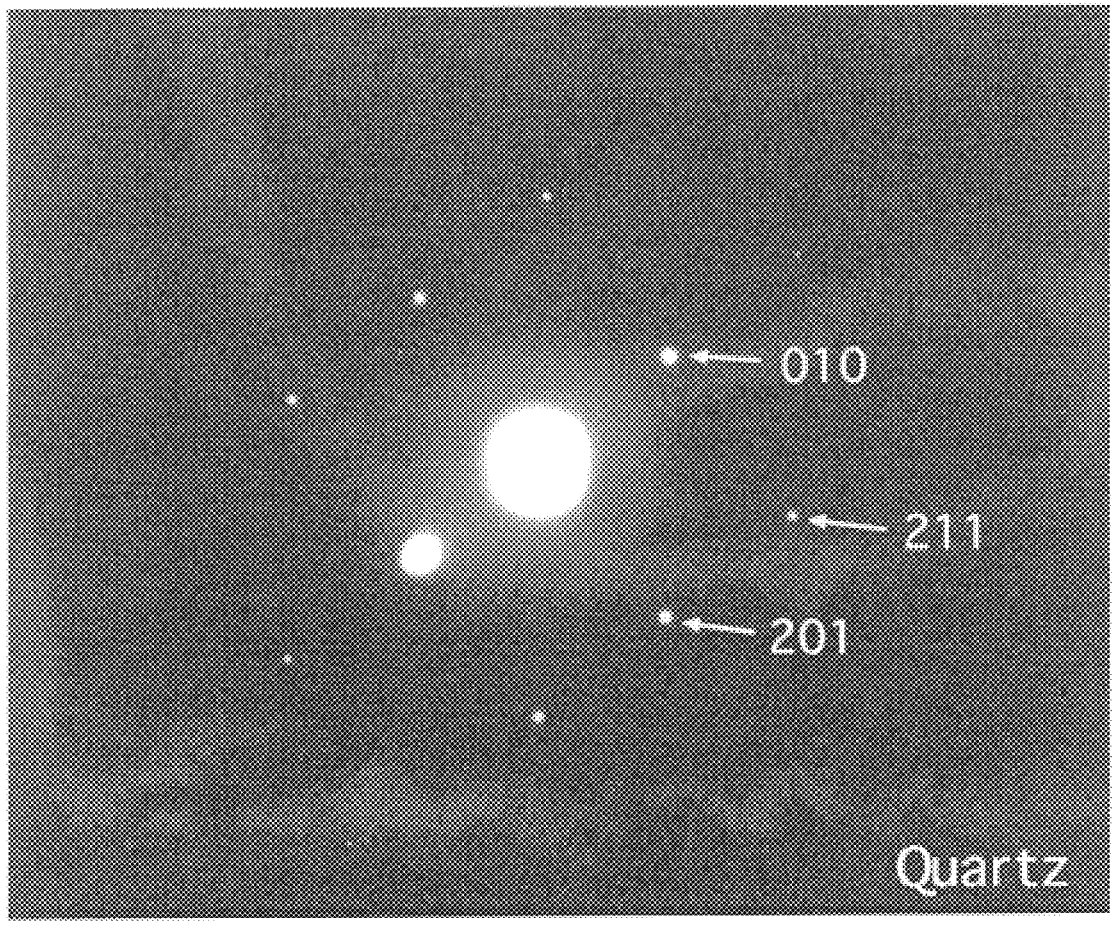
FIG. 4 is a transmission electron beam diffraction photo.
Figure 5:
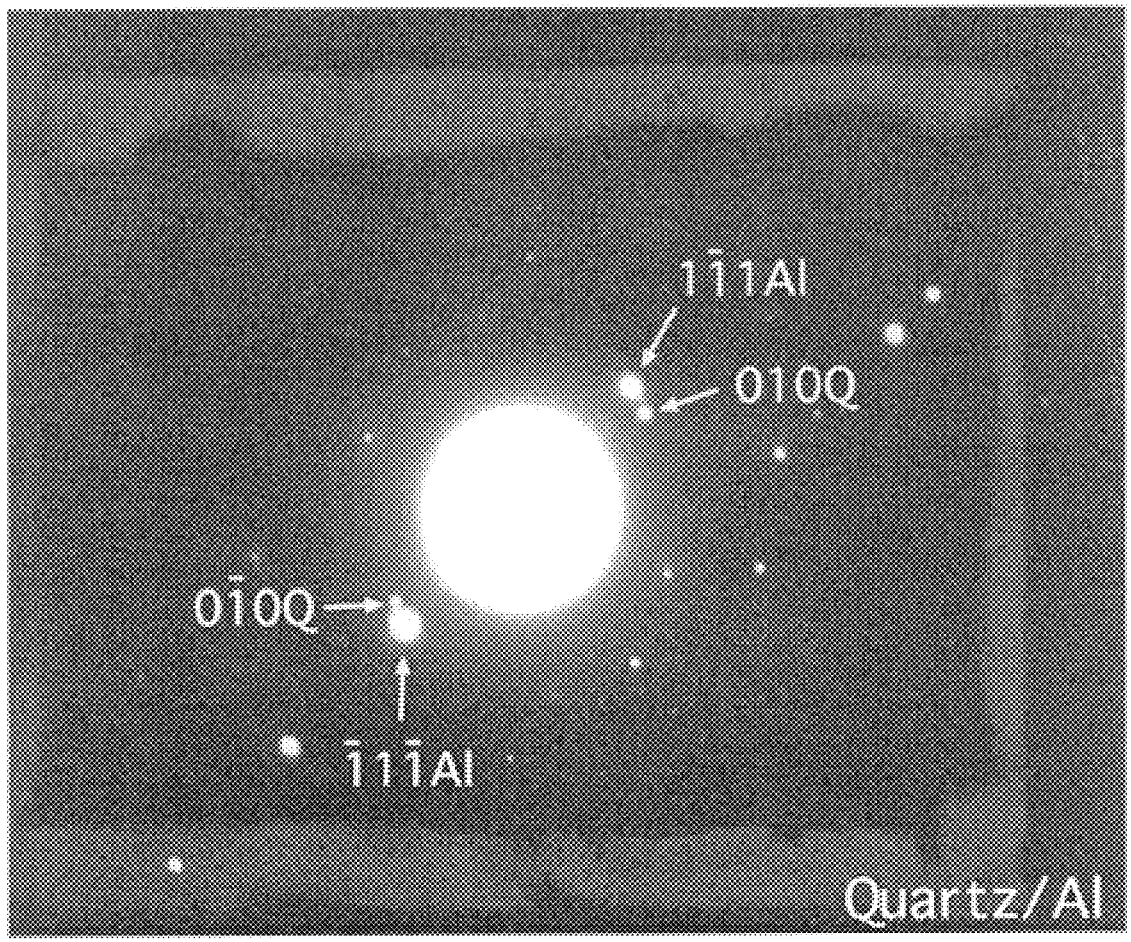
FIG. 5 is a transmission electron beam diffraction photo.
Figure 6:
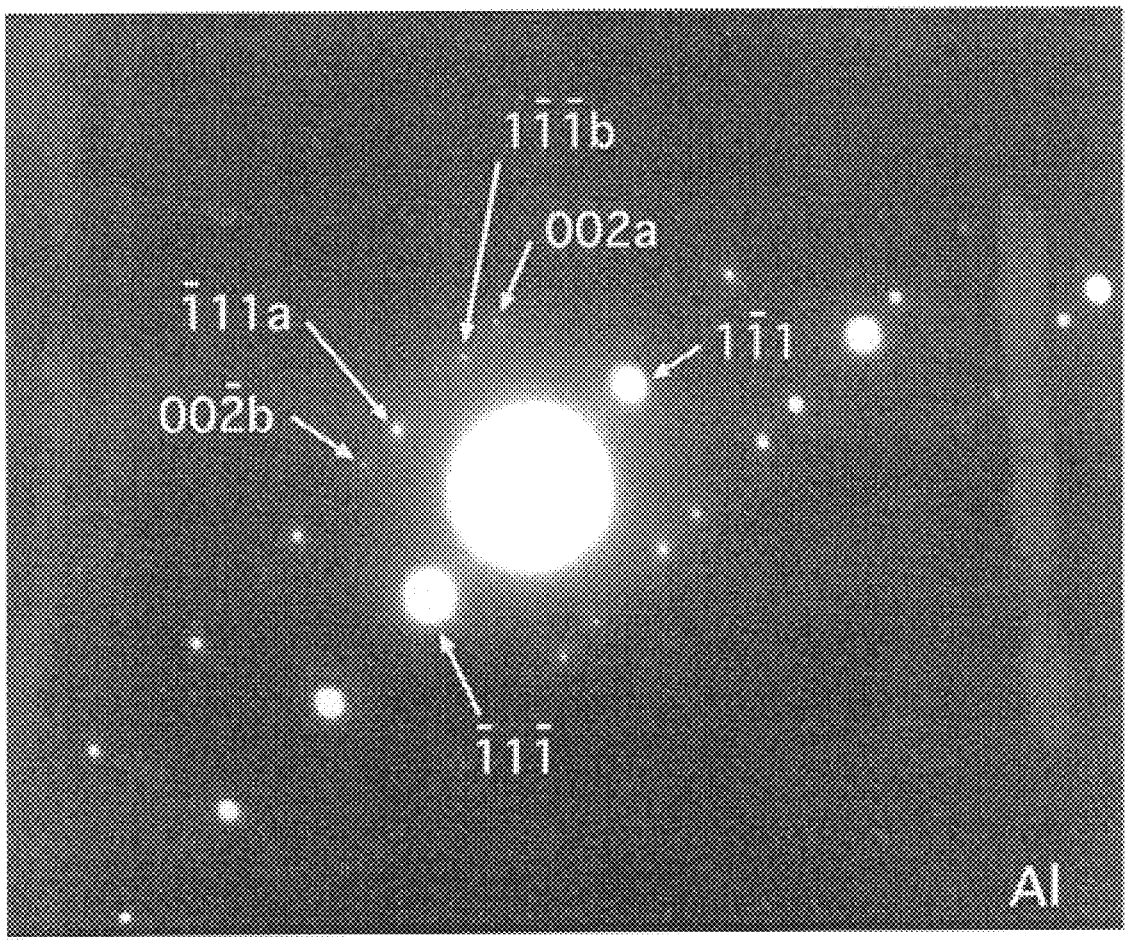
FIG. 6 is a transmission electron beam diffraction photo.

The obtained transmission electron beam diffraction photos are shown in FIG. 4, FIG. 5, and FIG. 6. FIG. 4 is an electron beam diffraction photo of the quartz part (Diffraction photo ①), FIG. 5 is a transmission electron beam diffraction photo of the boundary part of the quartz and aluminum film (Diffraction photo ②), and FIG. 6 is a transmission electron beam diffraction photo of the aluminum film part (Diffraction photo ③). Here, in FIG. 5 and FIG. 6, each diffraction image of the aluminum layer is a diffraction image of two or more crystal grains across a twin boundary. Namely, in FIG. 5 and FIG. 6, each diffraction image of the aluminum layer is a diffraction image of crystal grains including the three crystal grains a/b/a in FIG. 3.

As shown in FIG. 4, it has been confirmed that the incidence of the electron beam is from the direction of the [−1 0 2] crystal zone axis.

As shown in FIG. 5, it has been confirmed that the {1 1 1} plane of aluminum is oriented to be inclined by 8° to the {0 1 0} plane of quartz.

As shown in FIG. 6, it has been confirmed that a crystal grain (crystal grain a in FIG. 2 and FIG. 3) of the (−1 1 1) plane and the (0 0 2) plane of aluminum and a crystal grain (crystal grain b in FIG. 2 and FIG. 3) of the (1 −1 −1) plane and the (0 0 −2) plane of aluminum are in a twin relationship having the (−1 1 −1) plane and the (1 −1 1) plane of aluminum as the twin boundaries.

In this instance, transmission electron beam diffraction was performed using a similar apparatus as that of the above [2.1] with a limited field aperture of 10 μm in diameter.

3. Measuring the Frequency Change of the Surface Acoustic Wave Device Over Time

First of all, as this embodiment, the change in the oscillation frequency over time was measured for a surface acoustic wave device manufactured by the method described in "1. Manufacturing a surface acoustic wave device".

Furthermore, as a comparison, the change in the oscillation frequency over time was also measured in the same way as the above for a surface acoustic wave device having electrodes made of randomly-oriented polycrystal of aluminum-Cu (0.2 wt %) alloy (called "Comparison 1" below) and a surface acoustic wave device having an electrode made of randomly-oriented polycrystaline aluminum (called "Comparison 2" below).

Here, in each of these embodiments, Comparison 1, and Comparison 2, measurement was performed for two surface acoustic wave devices.

Figure 7:
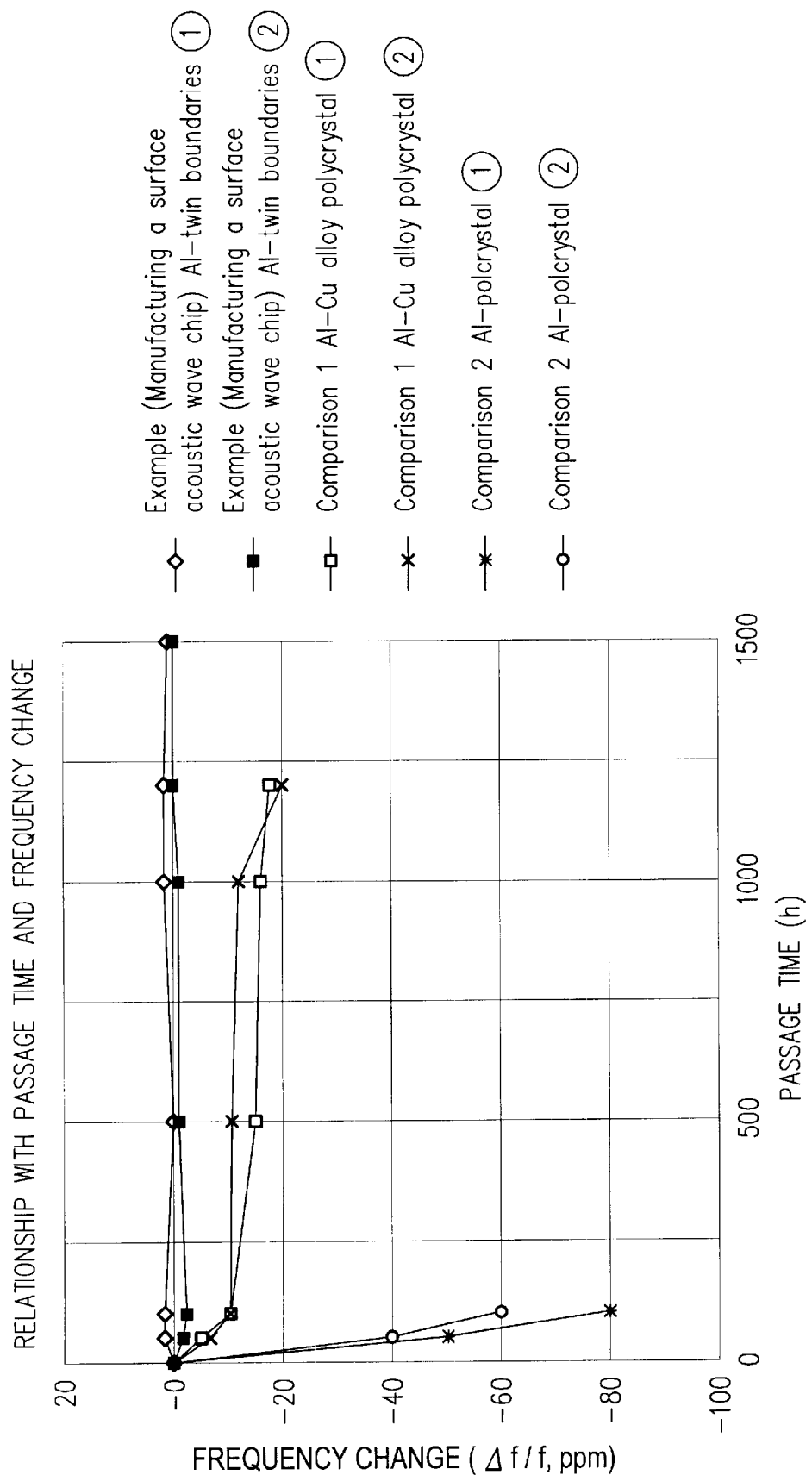
FIG. 7 is a graph showing the frequency change of the surface acoustic wave device over time, in an embodiment of this invention.

The results are shown in FIG. 7.

As shown in FIG. 7, the surface acoustic wave devices of this embodiment both had their oscillation frequency change suppressed at 1 ppm or less even after 1500 hours of operation.

On the other hand, as shown in FIG. 7, oscillation frequency of both surface acoustic wave devices in Comparison 1 had decreased by 15 ppm or more after 1200 hours of operation. Also, the oscillation frequency of both of the surface acoustic wave devices in Comparison 2 had decreased by 60 ppm or more after 100 hours of operation.

Thus, it has been confirmed that the surface acoustic wave devices of this embodiment have an oscillation frequency which is difficult to change even after a long period of operation, namely the surface acoustic wave devices of this embodiment have little change over time and are stably usable for an extended period.

Here, all these measurements were done with the oscillation frequency of the surface acoustic wave devices unified to 300 MHz and the power supplied to the surface acoustic wave devices unified to 10 mW.

Figure 8:
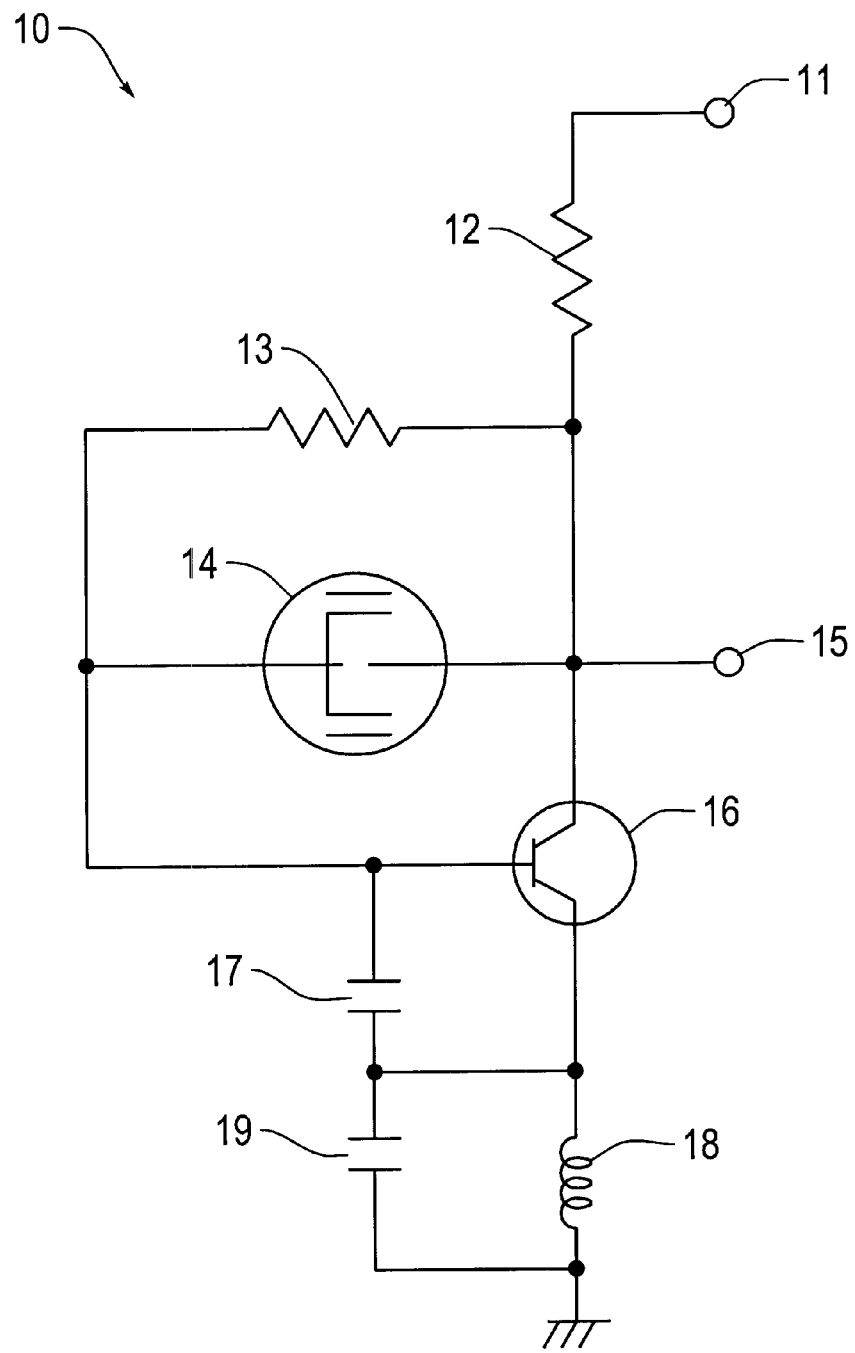
FIG. 8 is a circuit diagram which measures frequency change over time in the surface acoustic wave device of an embodiment of this invention.

Also, all these measurements were performed using the oscillating circuit 10 shown in FIG. 8.

As shown in FIG. 8, the oscillating circuit 10 has a power supply terminal 11, a resistor 12, a resistor 13, a surface acoustic wave device 14 whose oscillation frequency is measured, an output terminal 15, a transistor 16, a capacitor 17, a coil 18, and a capacitor 19. Here, the power supply terminal 11 is connected to a DC power supply, not shown, and the output terminal 15 is connected to a frequency measurement instrument, also not shown.

The surface acoustic wave device 14 oscillates by the electric current supplied by the DC power supply and outputs a high-frequency wave (300 MHz). This output high-frequency wave is amplified by the transistor 16. The high-frequency wave amplified by the transistor 16 is input to the frequency measurement instrument connected to the output terminal 15. Thus, the oscillation frequency of the surface acoustic wave device 14 is measured.

As stated above, a surface acoustic wave device with small change over time and an oscillation frequency that is hard to vary even after a long period of use can be obtained by this invention.

Therefore, a high-frequency wave circuit using this kind of surface acoustic wave device is highly reliable.

Therefore, by using this kind of surface acoustic wave device in equipment using high-frequency waves such as portable phones and wireless communication equipment, the reliability, stability, and accuracy of this equipment can be enhanced.

What is claimed is:

1. An electronic equipment comprising a surface acoustic wave device, the surface acoustic wave device comprising:
   a substrate made of piezoelectric material; and
   an electrode installed on the substrate, said surface acoustic wave device oscillating by conduction to said electrode, said electrode comprising a layer of polycrystalline aluminum having crystal boundaries that are twin boundaries.

2. An electronic equipment comprising a surface acoustic wave device, the surface acoustic wave device comprising:
   a substrate made of piezoelectric material; and
   an electrode installed on the substrate, said surface acoustic wave device oscillating by conduction to said electrode, said electrode comprising an alloy of aluminum and other metals and crystal boundaries in the alloy being twin boundaries.

* * * * *